United States Patent [19]

Foss et al.

[11] Patent Number: 5,574,681
[45] Date of Patent: *Nov. 12, 1996

[54] METHOD FOR DRAM SENSING CURRENT CONTROL

[75] Inventors: Richard C. Foss, Kirkcaldy Fife, Scotland; Peter B. Gillingham, Kanata; Robert Harland, Carp, both of Canada; Masami Mitsuhashi, Gunma; Atsushi Wada, Okazaki, both of Japan

[73] Assignee: Mosaid Technologies Incorporated, Kanata, Canada

[*] Notice: The term of this patent shall not extend beyond the expiration date of Pat. No. 5,414,662.

[21] Appl. No.: 377,622

[22] Filed: Jan. 25, 1995

Related U.S. Application Data

[63] Continuation of Ser. No. 147,038, Nov. 4, 1993, Pat. No. 5,414,662, which is a continuation of Ser. No. 680,747, Apr. 5, 1991, abandoned.

[30] Foreign Application Priority Data

Apr. 6, 1990 [GB] United Kingdom ............... 9007789

[51] Int. Cl.⁶ ..................................................... G11C 7/00
[52] U.S. Cl. ......................... 365/149; 365/205; 365/208
[58] Field of Search .................................. 365/149, 205, 365/207, 208, 189.01; 327/51, 52

[56] References Cited

U.S. PATENT DOCUMENTS

| | | | |
|---|---|---|---|
| 4,780,850 | 10/1988 | Miyamoto et al. | 365/149 |
| 4,941,128 | 7/1990 | Wada et al. | 365/203 |
| 4,943,960 | 7/1990 | Komatsu et al. | 365/203 X |
| 5,020,031 | 5/1991 | Miyatake | 365/203 |
| 5,414,662 | 5/1995 | Foss et al. | 365/208 X |

*Primary Examiner*—Son Dinh
*Attorney, Agent, or Firm*—Pascal & Associates

[57] ABSTRACT

A DRAM having a plurality of bit lines and associated sense amplifiers, the bit lines being arrayed across an integrated circuit chip and the sense amplifiers being disposed in a row, a pair of low resistance power supply conductors extending in parallel with the row for carrying logic high level and logic low level voltages, sense amplifier enabling signal conductors extending across the chip accessible to the sense amplifiers, apparatus for coupling sense inputs of the sense amplifiers to the power supply conductors, and apparatus coupling the sense amplifier enabling signal conductors to the apparatus for coupling sense inputs, for enabling passage of current resulting from the logic high level and low level voltages to the sense amplifiers.

2 Claims, 3 Drawing Sheets

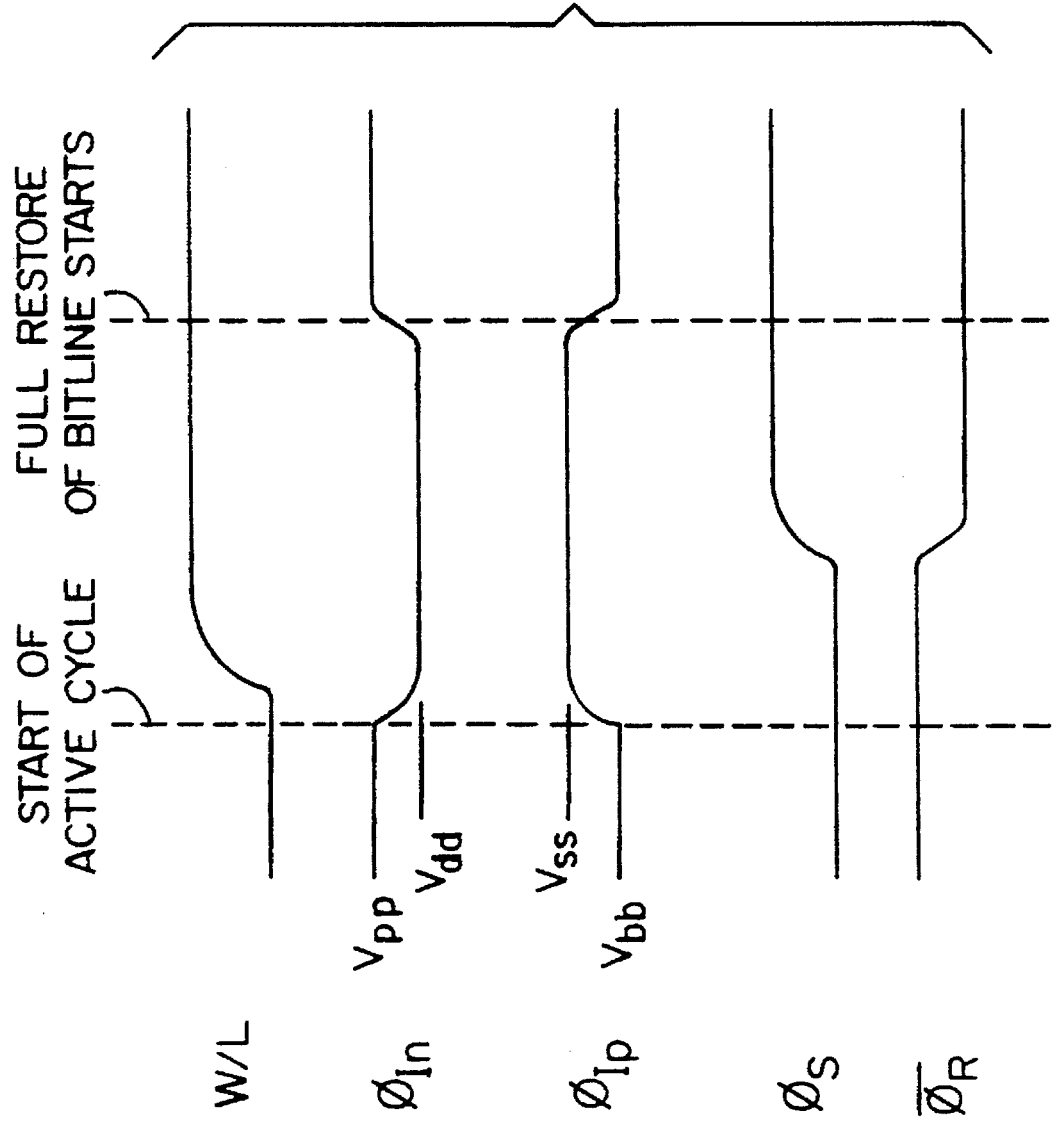

METHOD FOR DRAM SENSING CURRENT CONTROL

This is a continuation of application Ser. No. 08/147,038 filed Nov. 4, 1993, U.S. Pat. No. 5,414,662, which is a continuation of application Ser. No. 07/680,747 filed Apr. 5, 1991, now abandoned.

FIELD OF THE INVENTION

This invention relates to semiconductor dynamic random access memories (DRAMs) and in particular to apparatus and methods for controlling the sensing of bit lines.

BACKGROUND TO THE INVENTION

A DRAM is generally formed of an array of bit storage capacitors which are accessed via word lines and bit lines, the word lines being located in rows and the bit lines being located in columns. The capacitors are coupled via access transistors to the bit lines upon being enabled by the word lines; each capacitor is thus associated with the intersection of a bit line and word line.

In high speed DRAMs, the bit lines are usually provided as a folded bit line (pairs of complementary bit lines), with a sense amplifier connected to both bit lines of a folded bit line. During a read operation the charge stored on a capacitor is dumped on one of the lines of the folded bit line, and the sense amplifier senses the resulting differential in potential between the two lines of a folded bit line, applying full logic voltage levels to the bit lines which both restore the charge on the storage capacitors and apply full logic levels to data buses to which the bit lines are coupled.

Bit lines typically have a capacitance of around 0.2– 0.5 pF. During sensing, current being passed through the sense amplifier to provide full logic voltage levels on the bit lines is consumed in charging the capacitance of the bit lines. The bit line voltage differential must exceed a certain noise margin before the levels on the bit lines can be read to the databuses. Clearly the voltage differential on the lines of the bit lines must be above that certain level, which requires a substantial capacitor charging time, which in turn results in a slowed sensing interval.

A technique for attempting to deal with bit line capacitance is to insert an isolation device to isolate the sense nodes associated with the sense amplifier from the bit lines during the initial sensing period. In other words, a memory capacitor associated with one of the lines of the bit line is enabled to dump its charge on one bit line, following which both bit lines are completely isolated from the sense amplifier. Since the small amount of capacitance associated with the sense node retains some charge differential, subsequent enabling of the sense amplifier causes it to sense this differential, and to apply the full logic level to the sense nodes for application to the databus. Since the sense nodes are now completely isolated from the bit lines, the bit lines need not be charged up by the power supply associated with the sense amplifier, and the time for charging the bit line capacitances thus is substantially eliminated.

However since the capacitance associated with the sense nodes isolated from the bit lines is so small, only a fraction of the total charge differential is available for sensing. This is dangerous, in the sense that the differential can be marginal, and an erroneous bit sensed. In addition, operation of the isolators introduces an additional step in a memory access sequence, sacrificing memory speed.

It has also been found that the conductive tracks which carry the sense amplifier clock signals must supply considerable current in order to provide, for all sense amplifiers on the chip, full logic levels. That current must not only charge the bit lines and sense nodes, but also the databuses. The conductive tracks across the semiconductor integrated circuit contains resistance, and the heavy clock current passing down the tracks creates a voltage difference. This creates a significant differential in the speed of operation of sense amplifiers close to the sense amplifier clock drivers from those at the far ends of the tracks. Access of data from the memory must be slowed to accommodate the slowest sense amplifier.

SUMMARY OF THE INVENTION

One embodiment of the present invention uses an isolation device as in the prior art described above, but utilizes an imperfect isolation device which can be enabled over an interval and in addition provide a voltage drop. Preferably the isolation device is a field effect transistor (FET) which has its source drain circuit in series between a sense node and an associated bit line. The gate of each FET is held at a voltage which maintains it imperfectly open, and changes to a level which allows each FET to conduct when the sense amplifier operates (e.g. its gate-source voltage is similar to the logic level supplied by the sense amplifier). The imperfect isolation referred to herein means that the source-drain of the FET is in a high resistance state, but allows some charge leakage through it.

Thus when the memory capacitor dumps its charge on the associated bit line, the charge leaks through the imperfect isolation device to the associated sense node of the sense amplifier. During a first part of the sense cycle the voltage on the gate of each isolating field effect transistor is changed to the logic level which is to be applied to the sense amplifier. Due to the leakage through the imperfect isolating device, charge from the memory capacitor leaks to the sense node.

During a subsequent portion of the sense interval, the sense amplifier is enabled. Due to the charge differential between its sense nodes, the sense amplifier applies full logic voltage level to the sense nodes, which is applied to the databuses. However due to the voltage drop across the isolating FET, there is significantly less current consumed in charging the bit line capacitance. As a result the sense nodes reach full logic levels considerably faster than in the prior art.

Some time after sensing is started, the gate source bias of the isolating FET is increased to allow bit lines to be charged to full logic levels (overcoming the threshold voltage drop in the FET). This allows bit line charging current to be distributed over time.

According to an embodiment of the present invention, a dynamic random access memory (DRAM) is comprised of a plurality of bit storage capacitors, a folded bit line for receiving charge stored on one of the capacitors, having bit line capacitance, a sense amplifier having a pair of sense nodes for sensing a voltage differential across the sense nodes, apparatus connected to the bit line and the sense nodes for imperfectly isolating the sense nodes from the bit line whereby current can leak therethrough, apparatus for enabling the sense amplifier and for disabling the isolating apparatus and thereby removing the isolation between the sense amplifier and the bit line, whereby current passing through the sense amplifier to the sense nodes is enabled to charge the bit line capacitance through the isolating apparatus to predetermined logic voltage level.

In accordance with another embodiment of the invention a dynamic random access memory (DRAM) is comprised of a plurality of bit lines and associated sense amplifiers, the bit lines being arrayed across an integrated circuit chip and the sense amplifiers being disposed in a row, a pair of low resistance power supply conductors extending in parallel with the row for carrying logic high level and logic low level voltages, sense amplifier enabling signal conductors extending across the chip accessible to the sense amplifiers, apparatus for coupling sense inputs of the sense amplifiers to the power supply conductors, and apparatus coupling the sense amplifier enabling signal conductors to the apparatus for coupling sense inputs, for enabling passage of current resulting from the logic high level and low level voltages to the sense amplifiers.

In accordance with another embodiment of the present invention a dynamic random access memory (DRAM) is comprised of a plurality of bit storage capacitors, a folded bit line for receiving charge stored on one of the capacitors having bit line capacitance, a sense amplifier having a pair of sense nodes for sensing a voltage differential across the sense nodes, the sense amplifier having respective sense enable and restore enable inputs for providing full high and full low logic levels respectively to the sense nodes, power supply apparatus for providing full high and full low logic level voltages, a pair of field effect transistors, one having its source-drain circuit connected between the restore enable input and the high logic level power supply voltage and the other having its source-drain circuit connected between the sense enable input and the power supply low-logic level power supply voltage, and apparatus for providing restore and sense signals to gates of the one and other field effect transistors respectively, whereby restore and sense current is supplied to the sense amplifier from the power supply apparatus rather than from the apparatus for providing restore and sense signals.

In accordance with a further embodiment of the invention, a method of sensing in a folded bit line type of dynamic random access memory (DRAM) having a bit storage capacitor for coupling to the bit line and a sensing amplifier having sense nodes, is comprised of the steps of imperfectly isolating the sense nodes of the sensing amplifier from the bit line using an imperfectly isolating apparatus, coupling the capacitor to the bit line thereby dumping its charge thereon, leaking the charge through the imperfect isolating apparatus to one of the sense nodes thereby causing a voltage differential across the sense nodes, sensing the differential by the sense amplifier, and applying full high and low logic levels respectively to the sense nodes, and, inhibiting isolation of the sense nodes from the bit line, whereby full logic levels are applied to the complementary bit lines.

In accordance with another embodiment of the present invention, in order to make substantially more equal the enabling time of the sense amplifiers closest to their clock driver and those farthest away, the enabling inputs to the sense amplifiers are connected through local pull down field effect transistors to local power supply tracks which have little resistance from one end to the other of the integrated circuit memory. The gates of these pull down transistors are connected to the sense amplifier clock conductive tracks since very little current is required by the gates of those transistors, and very little voltage drop thus occurs between the near and far ends of the integrated circuit. Accordingly enabling of the sense amplifiers is substantially speeded at locations remote from the near end sense amplifiers, and there is substantially reduced differential in enabling speed between the near and far end of the sense amplifiers.

In order to reduce the number of transistors required, groups of sense amplifiers may be coupled to the same pull down transistors.

BRIEF INTRODUCTION TO THE DRAWINGS

A better understanding of the invention will be obtained by reference to the detailed description below, in conjunction with the following drawings, in which:

FIG. 1 is a schematic diagram of a portion of a bit line circuit and sense amplifier in accordance with the prior art, FIG. 2 is a schematic diagram of a portion of a bit line circuit and sense amplifier in accordance with the present invention, and FIG. 3 is a waveform diagram used to describe the function of the present invention.

DETAILED DESCRIPTION OF THE PREFERRED EMBODIMENTS OF THE INVENTION

Figure 1:
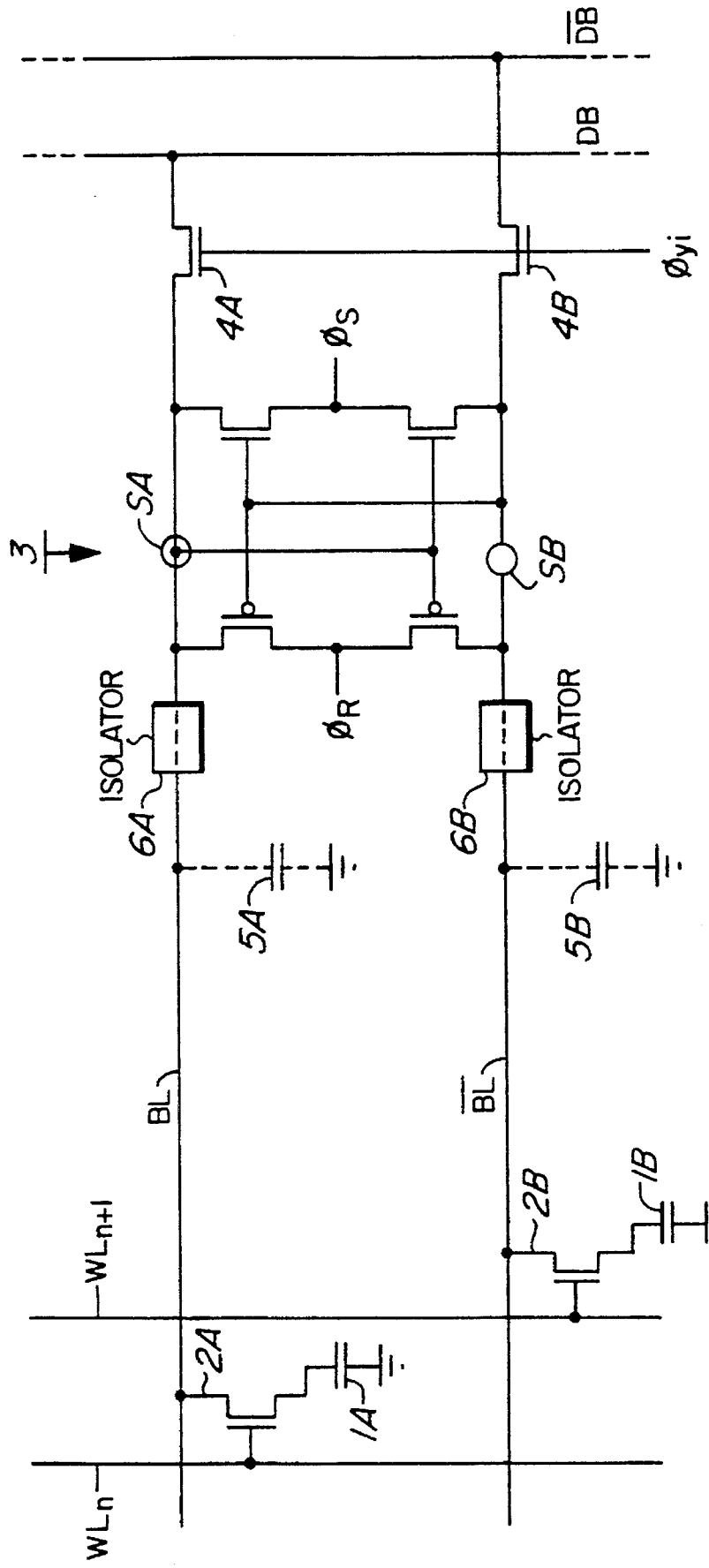

Turning first to FIG. 1, a portion of a prior art bit line and sense amplifier circuit is shown. Bit storage capacitors 1A and 1B are coupled through field effect transistors (FETs) 2A and 2B to complementary bit lines BL and /BL of a folded bit line. The gates of transistors 2A and 2B are connected to word lines $WL_n$ and $WL_{n+1}$ in a well known manner.

A sense amplifier 3 is connected to the bit lines also in a well known manner. The bit lines are coupled to databuses DB and /DB via FETs 4A and 4B.

The sense amplifier 3 is formed of a pair of N-channel transistors having their series connected source-drain circuits connected across the bit lines of the folded bit line, their junction being connected to an active low logic level source $/\phi_s$, and a pair of P-channel FETs having their series connected source-drain circuits connected across bit lines BL and /BL, their junction being connected to an active high level source $\phi_R$. The gates of the N and P-channel transistors connected to a first bit line are connected together and to the other bit line, and the gates of the transistors connected to the other transistor are connected together and to the first bit line.

In operation a transistor e.g. 2B is enabled from a word line, and the charge, representing a bit, stored on a capacitor e.g. 1B is dumped to the associated bit line /BL. This creates a voltage differential between bit lines BL and /BL which appears across sense nodes SA and SB. When the logic levels $/\phi_s$ and $\phi_R$ are applied to the sense amplifier 3, the voltage differential causes the circuit to latch, applying the full logic levels of $/\phi_s$ and $\phi_R$ to the bit lines. This restores the charge on the capacitor 1B to full logic level. Upon enabling of the transistors 4A and 4B by the signal $/\phi_{yi}$, the resulting full logic level on the bit lines is applied to the databuses DB and /DB.

Associated with each bit line is an inherent capacitance 5A and 5B, which results from the length and breadth of the bit line track on the semiconductor and the substrate. Those capacitances 5A and 5B must be charged by the current from the power supply supplying the full logic levels $/\phi_s$ and $\phi_R$. This takes a considerable period of time and current requirement.

Therefore isolators 6A and 6B have been used to isolate the bit line from the sensing nodes SA and SB associated with the sense amplifier. The isolators are devices which completely isolate the bit lines from the sense nodes.

As noted earlier, while the aforenoted device was successful in isolating the bit lines from the sense nodes, thus eliminating the requirement to charge the bit line capacitances 5A and 5B during the initial part of the sensing interval, the differential between sense nodes was sometimes uncertain and sometimes small, and was affected by noise, or even being below the noise level. Accordingly an incorrect bit value could be sensed.

In addition, since the isolator must be turned on and off, additional steps in the memory access sequence must be performed. Further, the isolator must be inhibited in order to restore the logic level to the memory capacitor and indeed, if an incorrect bit were read, the restored bit value would also be incorrect. Clearly both speed and reliability of the memory were sacrificed.

Figure 2:
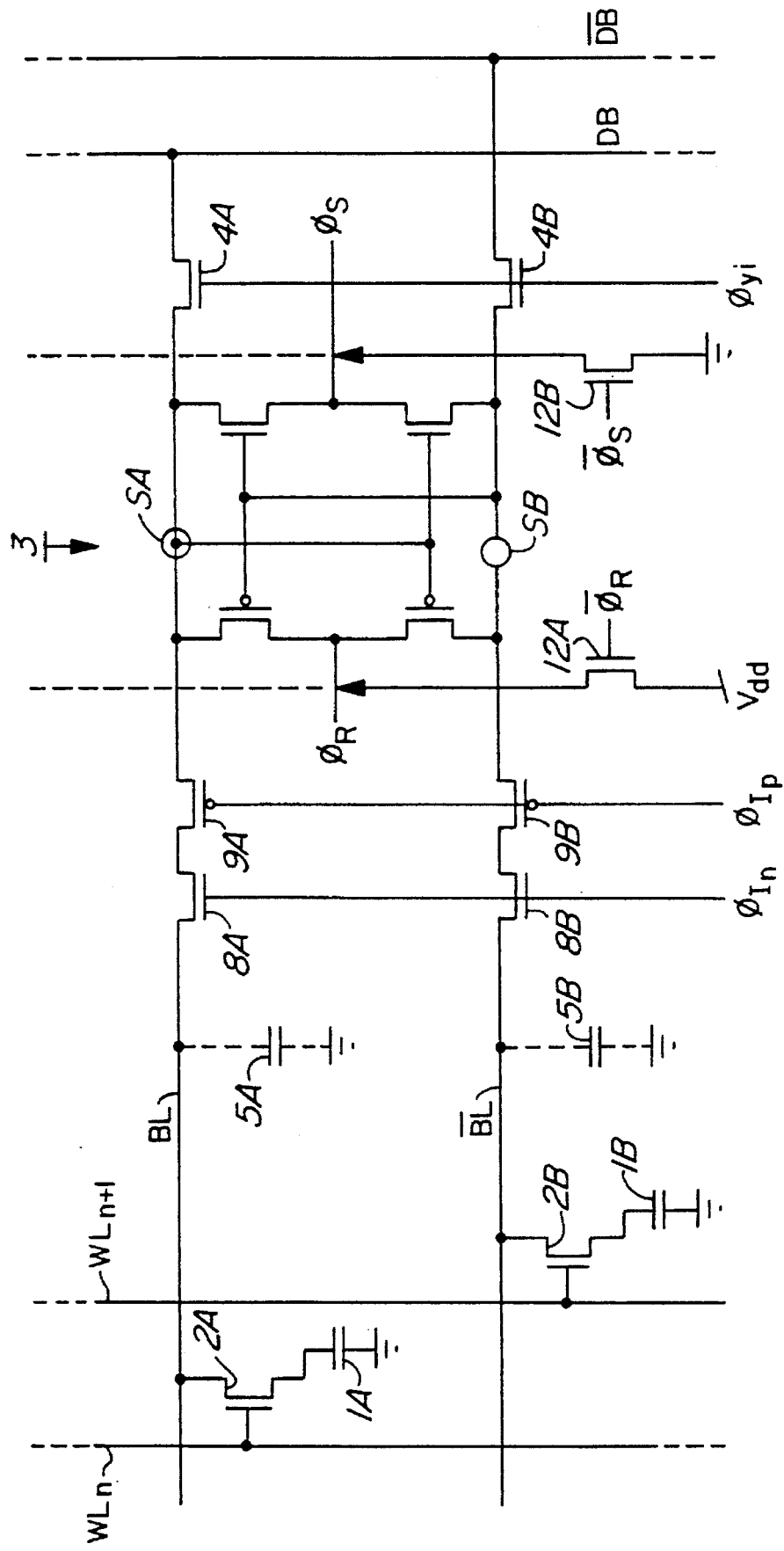

FIG. 2 illustrates an embodiment of the present invention. An imperfect isolation device 8A and 8B, driven from a source $\phi_{In}$ is connected in series between each bit line and each sense node. In the embodiment shown in FIG. 2 the imperfect isolation devices are N-channel enhancement mode FETs 8A and 8B. However alternatively, or in addition, P-channel enhancement mode FETs are connected in series between each bit line and each sense node. The gates of the transistors 9A and 9B are connected together to a logic source $\phi_{Ip}$.

With reference to FIGS. 2 and 3, operation of the device is as follows. At the beginning of an active cycle the voltage $\phi_{IN}$ is brought from a boosted level, e.g. $V_{pp}$ to a lower level that still allows cell charge to flow to the sense amplifier as noted, e.g. $V_{dd}$. Then, as described earlier, either transistor 2A or 2B is enabled, causing the charge on either bit storage capacitor 1A or 1B to be dumped on an associated bit line. Charge on the bit line leaks through the high resistance source-drain circuit transistor 8A or 8B (assuming transistors 9A and 9B are not present) to the sense node SA or SB, charging the small capacitance associated therewith.

Subsequently the sense amplifier 3 is enabled by applying high logic level $\phi_s$ and low logic level $/\phi_R$, as described earlier. The sense amplifier is caused to apply the full logic levels $\phi_s$ and $/\phi_R$ to the sense nodes SA and SB, latching due to the differential thereacross. However due to the voltage drop between the sources and drains of transistors 8A and 8B, bit line capacitances 5A and 5B will only be charged up to a reduced voltage less than full logic level applied to the sense nodes. Since capacitances 5A and 5B are charged a reduced amount, the sensing interval is considerably reduced from the prior art; the sensing is faster because the sense node voltage differential develops faster for the same sense current budget. Data can be read out over the data bus by enabling column access transistors 4A and 4B, as soon as a sufficient potential exists across the sense nodes. Hence memory access time is improved by the isolation devices. While the restore charge on capacitors 1A and 1B is less than full logic level, they can be fully restored after column access.

After the peak current has occurred in the first stage of sensing the $\phi_{IN}$ level is brought back up to the boosted level $V_{pp}$ to allow full restore of the bit lines. This causes a second peak in sensing current. Compared to prior art sensing current peaks are lower and are distributed over time.

It was noted earlier that P-channel transistors 9A and 9B could be used in place of transistors 8A and 8B, or in series therewith as shown in the figure. If P-channel transistors are used, their gates should initially be at a $\phi_{Ip}$ level $V_{bb}$, and are raised to a level $V_{ss}$ during the initial part of sensing when a high impedance isolation device is required.

It had been noted earlier that resistive voltage drops in the conductive tracks in the semiconductor memory from the sense amplifier driver circuits to the far end of the array cause quick sensing at the near end of the array (close to the sense amplifier driver circuits) and slow (retarded) sensing at the far end of the array. Thus memory access must be delayed to accommodate the sensing of the slowest column.

According to another embodiment of the invention, rather than driving the logic $/\phi_s$ and $\phi_R$ input leads of the sense amplifiers directly from the sense amplifier drivers, local pull down FETs or pull up FETs are used. Indeed, these FETs may be shared among several sense amplifiers in adjacent columns.

As shown in FIG. 2, rather than the sense amplifier being connected to $/\phi_S$ and $\phi_R$ logic sources, they are connected through the source-drain circuits of FETs 12A and 12B to voltage sources $V_{dd}$ and ground ($V_{ss}$) respectively. The gates of transistors 12A and 12B are driven from the $/\phi_R$ and $\phi_S$ logic sources respectively.

The ground and $V_{dd}$ power tracks on an integrated circuit memory normally are of low resistance. Therefore the provision of those sources to the sense amplifiers is through short and low resistance conductors.

However since the $/\phi_R$ and $\phi_S$ logic signals driving the gates of transistors 12A and 12B require only a small amount of current, there will be a considerably reduced voltage drop in their conductive tracks from one end of the memory to the other. Thus the difference in operation time of the sense amplifiers between the near and far ends is considerably reduced, and can be considerably increased in speed over prior art DRAMs.

The result of the last-described embodiment is increased reliability, since leaky bit lines which have been deprogrammed will not affect sense line current in other bit lines, if local sense clock drivers are shared only among bit lines with the same redundancy address. No additional power supplies are required other than those normally on the chip.

The result of the above embodiments is increase in sensing speed and more uniformity of sensing speed across a large DRAM.

It should be noted that either of the embodiments can be used separately or in conjunction. For example, N-channel bit line isolation devices could be used in conjunction with local sensing amplifier enabling pull downs as described, to control peak $V_{dd}$ current and $V_{ss}$ current respectively.

A person understanding this invention may now conceive of alternative structures and embodiments or variations of the above. All of those which fall within the scope of the claims appended hereto are considered to be part of the present invention.

We claim:

1. A dynamic random access memory (DRAM) comprising a plurality of bit lines and associated sense amplifiers, the bit lines being arrayed across an integrated circuit chip and the sense amplifiers being disposed in a row, a pair of low-resistance power supply conductors extending in parallel with said row across said chip for carrying logic high level and logic low level voltages, sense amplifier enabling signal conductors extending across said chip accessible to said sense amplifiers, means for coupling sense inputs of said sense amplifiers to said power supply conductors, and means coupling said sense amplifier enabling signal conductors to enabling inputs of said means for coupling sense inputs, for enabling passage of current resulting from said logic high level and low level voltages to said sense amplifiers, said means for coupling sense inputs of said sense amplifiers being comprised of local field effect transistors having their gates connected to said sense amplifier enabling signal conductors, said gates forming said enabling inputs.

2. A DRAM as defined in claim 1 in which the sense inputs of groups of said sense amplifiers are connected together to the same field effect transistor drain terminal.

* * * * *